United States Patent
Vetter et al.

(10) Patent No.: US 10,811,239 B2
(45) Date of Patent: Oct. 20, 2020

(54) CYLINDRICAL EVAPORATION SOURCE

(71) Applicant: OERLIKON SURFACE SOLUTIONS AG, PFÄFFIKON, Pfäffikon SZ (CH)

(72) Inventors: Joerg Vetter, Bergisch-Gladbach (DE); Stefan Esser, Aachen (DE); Jurgen Mueller, Olpe (DE); Georg Erkens, Aachen (DE)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 378 days.

(21) Appl. No.: 14/188,134

(22) Filed: Feb. 24, 2014

(65) Prior Publication Data

US 2014/0238852 A1    Aug. 28, 2014

(30) Foreign Application Priority Data

Feb. 26, 2013    (EP) .................... 13156790

(51) Int. Cl.
    *H01J 37/34* (2006.01)
    *H01J 37/32* (2006.01)
    (Continued)

(52) U.S. Cl.
    CPC ........ *H01J 37/3455* (2013.01); *C23C 14/325* (2013.01); *C23C 14/3407* (2013.01);
    (Continued)

(58) Field of Classification Search
    CPC ... C23C 14/325; C23C 14/3407; C23C 14/35; H01J 37/3402; H01J 37/345;
    (Continued)

(56) References Cited

U.S. PATENT DOCUMENTS 4,422,916 A    12/1983 McKelvey
5,160,595 A    11/1992 Munz
(Continued)

FOREIGN PATENT DOCUMENTS

CN    1938813    3/2007
CN    101956169 A  *  1/2011
(Continued)

OTHER PUBLICATIONS

Machine Translation JP01234562A.*
(Continued)

*Primary Examiner* — Michael A Band
(74) *Attorney, Agent, or Firm* — Greenblum & Bernstein, P.L.C.

(57) ABSTRACT

Cylindrical evaporation source which includes, at an outer cylinder wall, target material to be evaporated as well as a first magnetic field source and a second magnetic field source which form at least a part of a magnet system and are arranged in an interior of the cylindrical evaporation source for generating a magnetic field. In this respect, first magnetic field source and second magnetic field source are provided at a carrier system such that a shape and/or a strength of the magnetic field can be set in a predefinable spatial region in accordance with a predefinable scheme. In embodiments, the carrier system is configured for setting the shape and/or strength of the magnetic field of the carrier system such that the first magnetic field source is arranged at a first carrier arm and is pivotable by a predefinable pivot angle ($\alpha_1$) with respect to a first pivot axis.

21 Claims, 8 Drawing Sheets

(51) Int. Cl.
*C23C 14/35* (2006.01)
*C23C 14/34* (2006.01)
*C23C 14/32* (2006.01)

(52) U.S. Cl.
CPC ........ *C23C 14/35* (2013.01); *H01J 37/32055* (2013.01); *H01J 37/32614* (2013.01); *H01J 37/32669* (2013.01); *H01J 37/342* (2013.01); *H01J 37/345* (2013.01)

(58) Field of Classification Search
CPC ........... H01J 37/32669; H01J 37/32055; H01J 37/32614; H01J 37/3432; H01J 37/3455; H01J 37/342; H01J 37/3452
See application file for complete search history.

(56) References Cited

U.S. PATENT DOCUMENTS

| | | | |
|---|---|---|---|
| 5,262,032 A | | 11/1993 | Hartig et al. |
| 5,922,176 A | | 7/1999 | Caskey |
| 6,351,075 B1 | * | 2/2002 | Barankova .......... H01J 37/3266 118/723 MA |
| 2007/0089986 A1 | | 4/2007 | Richert et al. |
| 2008/0099329 A1 | | 5/2008 | Pavloff |
| 2010/0051445 A1 | | 3/2010 | Vetter |
| 2011/0079508 A1 | | 4/2011 | Hanika |
| 2012/0193226 A1 | | 8/2012 | Beers |
| 2012/0273343 A1 | | 11/2012 | Hanika |
| 2013/0146444 A1 | * | 6/2013 | Chetcuti ................. C23C 14/35 204/192.25 |

FOREIGN PATENT DOCUMENTS

| | | | | |
|---|---|---|---|---|
| CN | 102549706 | | 7/2012 | |
| DE | 32 29 969 | | 4/1983 | |
| DE | 217 964 | | 1/1985 | |
| DE | 10 2011 075 543 | | 11/2012 | |
| EP | 0 459 137 | | 12/1991 | |
| EP | 1 173 629 | | 8/2003 | |
| EP | 2 159 821 | | 3/2010 | |
| EP | 2 306 489 | | 4/2011 | |
| EP | 2 484 798 | | 8/2012 | |
| GB | 2393321 A | * | 3/2004 | .......... H01J 37/3405 |
| JP | 01234562 A | * | 9/1989 | |
| JP | 02004965 A | * | 1/1990 | |
| JP | 11029866 A | * | 2/1999 | |
| JP | 2005-060841 | | 3/2005 | |
| JP | 2005336520 A | * | 12/2005 | |
| JP | 2009-512788 | | 3/2009 | |
| JP | 2012-132039 | | 7/2012 | |
| WO | WO 90/02216 | | 3/1990 | |
| WO | WO 00/56946 | | 9/2000 | |
| WO | WO 2007/050305 | | 5/2007 | |

OTHER PUBLICATIONS

Machine Translation JP02004965A.*
EPO Office Action dated Aug. 21, 2014 issued in counterpart EP Application 13195135.2.
Office Action (With translation) dated Jun. 13, 2017 issued in counterpart CN Application 201410063566.9 (17 pages).
Office Action (With translation) dated Sep. 6, 2017 issued in counterpart JP Application 2014-019228 (16 pages).

* cited by examiner

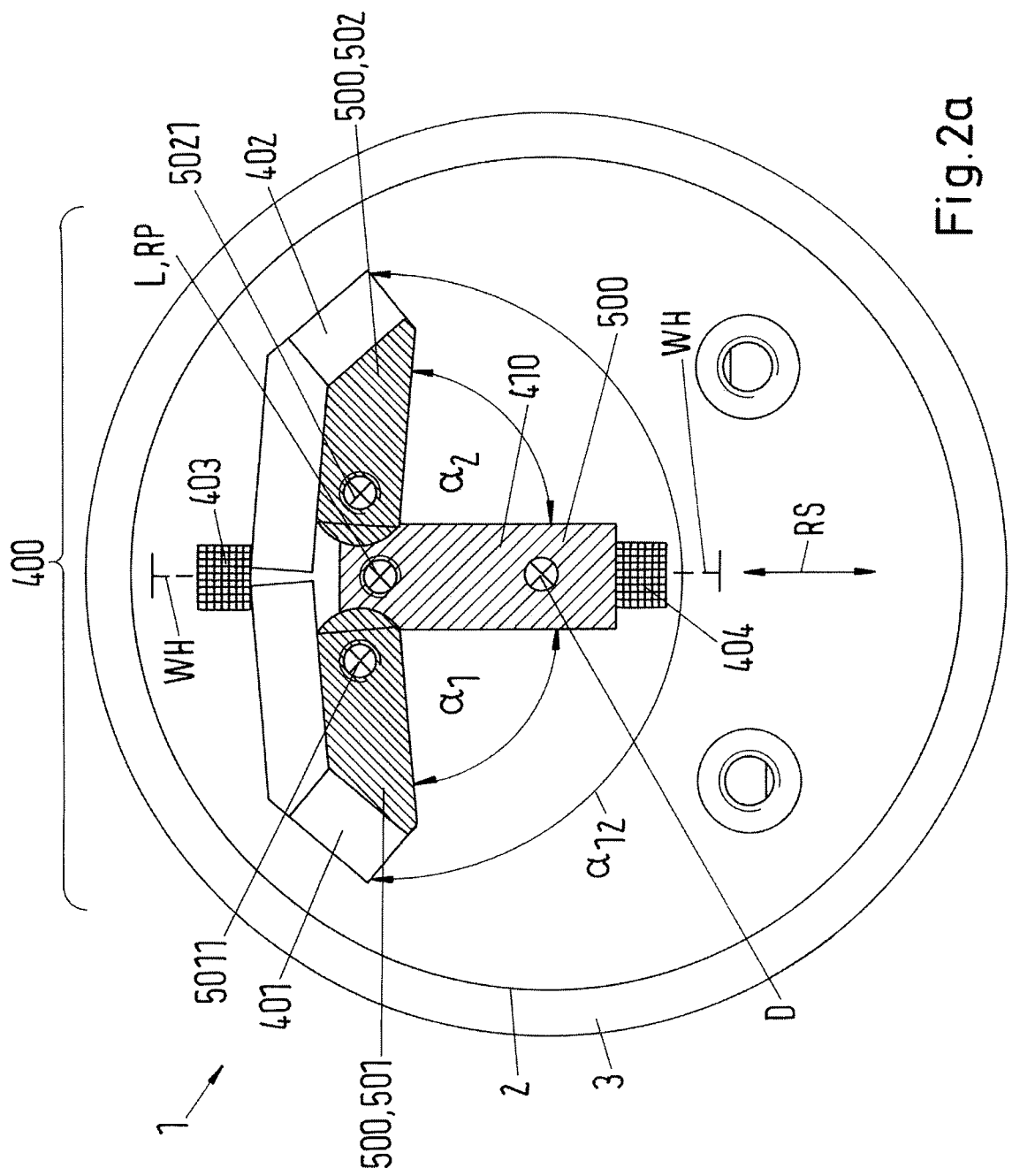

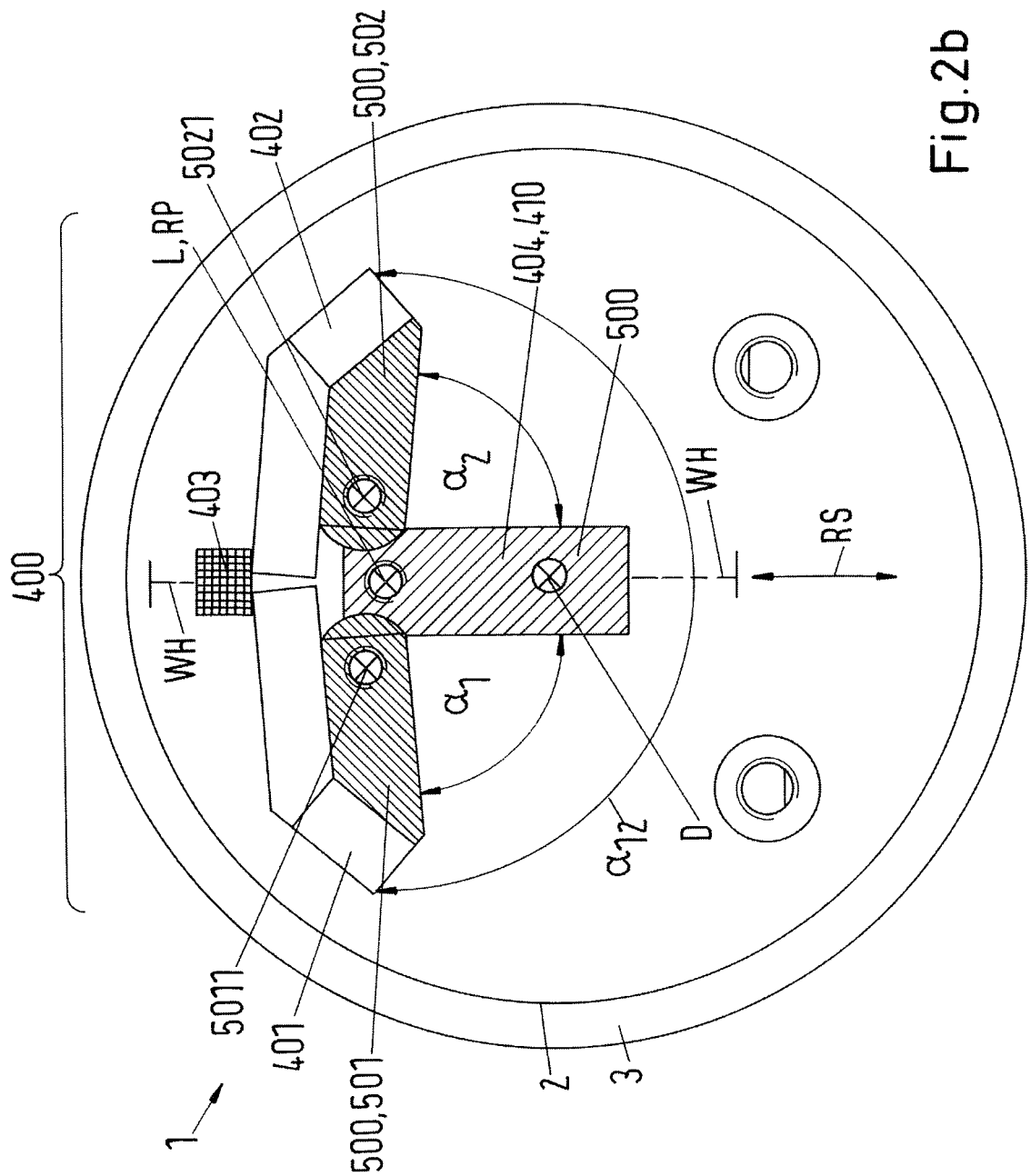

CYLINDRICAL EVAPORATION SOURCE

CROSS-REFERENCE TO RELATED APPLICATIONS

The present application claims priority under 35 U.S.C. § 119(a) of European Patent Application No. 131 56 790.1 filed Feb. 26, 2013, the disclosure of which is expressly incorporated by reference herein in its entirety.

BACKGROUND OF THE EMBODIMENTS

1. Field of the Invention

The invention relates to a cylindrical evaporation source, in particular for use in a sputtering process or in a vacuum evaporation process, preferably a cathode vacuum evaporation process, in accordance with the preamble of independent claim 1.

2. Discussion of Background Information

A whole series of different chemical, mechanical and physical techniques are known from the prior art for the application of layers or layer systems to the most varied substrates, each of which techniques are valid and have corresponding advantages and disadvantages in dependence on the demand and on the area of use.

Processes are in particular common for the application of comparatively thin layers or films in which the surface of a target is converted into the vapor form in an arc or atoms from a surface of a target are converted into the vapor form by means of ionized particles, with the vapor thus formed being able to be deposited on a substrate as a coating.

In a conventional embodiment of cathode atomization, the target is connected in a sputtering process to a negative non-pulsed DC voltage source or, e.g., to a unipolar or bipolar pulsed source or is operated in HIPIMs mode or is connected to a radio frequency power source. The discharge is as a rule amplified by magnet systems. Magnetron atomization is then spoken of. The substrate is the material to be coated and it is located opposite the target, for example. The substrate can be grounded, electrically floating, biased, heated, cooled or can be subjected to a combination thereof. A process gas is introduced into the process chamber, which inter alia contains the process electrodes and the substrate, to create a gas atmosphere in which a glow discharge is triggered and can be maintained. The gas pressures range in dependence on the application from a few tenths of a Pascal to several Pascals. Argon is a frequently used atomizer gas.

When the glow discharge is triggered, positive ions impact the surface of the target and predominantly release neutral target atoms by impact force transmission. They condense on the substrate to form thin films. There are additionally other particles and radiations which are generated by the target and all have film-forming properties (secondary electrons and ions as well as photons). The electrons and negative ions are accelerated toward the substrate platform and bombard it and the growing film. In some cases, a bias potential is applied to the substrate holder so that growing film is exposed to the bombardment with positive ions. This process is also known as bias atomization or ion plating.

In certain cases, not only argon is used, but also other gases or gas mixtures. This typically includes some types of reaction atomizer processes in which a composition is synthesized by atomization of a metal target (e.g., B, Ti) in an at least partly reactive reaction gas to form a composition of the meal and the reaction gas types (e.g., titanium oxides). The atomization yield is defined as the number of atoms expelled from the target surface per incident ion. It is an essential parameter for characterizing the atomizer process.

An estimated one percent of the energy incident on a target surface typically results in the expulsion of atomized particles; 75% of the incident energy results in a heating of the target and the remainder is dissipated by secondary electrons, for example, which can bombard and heat the substrate. An improved process known as magnetron atomization uses magnetic fields for conducting the electrons away from the substrate surface, whereby the heat effect is reduced.

For a given target material, the application rate and the uniformity are influenced inter alia by the system geometry, the target voltage, the atomizer gas, the gas pressure and the electrical power applied to the process electrodes and in particular also by the strength and the geometry of the magnetic fields used in the process.

One used physical coating process is the known arc evaporation in its many embodiments.

In arc evaporation, the target material is evaporated by the effect of vacuum arcs. The target source material is the cathode in the arc circuit. The base components of a known arc evaporation system include a vacuum chamber, a cathode and an arc current connection, parts for igniting an arc on the cathode surface, an anode, a substrate and a power connection for a substrate bias voltage. The arcs are maintained by voltages in the range from 15-50 volts, for example, depending on the target cathode material which is used. Typical arc currents lie in the range from 30-400 A. The arc ignition takes place by the customary ignition processes known to the skilled person.

The evaporation of the target material from the cathode which forms the target is produced as the result of a cathode arc spot which in the simplest case is moved without regulation on the cathode surface at speeds, of typically 10 m/s. The arc spot movement can in this respect, however, also be controlled with the aid of suitable confinement limits and/or magnetic fields. The target cathode material can be a metal or a metal alloy, for example.

The arc coating process is considerably different from other physical vapor coating processes. The core of the known arc processes is the arc spot which generates a material plasma. A high percentage, e.g., 30%-100%, of the material evaporated by the cathode surface is ionized as a rule, with the ions being able to exist in different charge states in the plasma, for example as Ti+, Ti2+, Ti3+, etc. The kinetic energy of the ions can in this respect be in the range from, e.g., 10-100 eV.

These features result in coatings which can be of a very high quality and can have specific advantages in comparison with those coatings which are applied by other physical vapor coating processes.

Exactly as in the above-described sputtering processes, the strength and geometry of the magnetic fields used also play a central role in arc evaporation processes. They inter alia determine the properties of the layers, in particular also their quality, to a substantial degree. The magnetic fields can, however, also by all means considerably influence the costs of the evaporation processes, whether an arc process or a sputtering process, for example in that the coating times are optimized or the utilization of the targets or of the target material is optimized or in that the magnetic fields used have a positive effect on other parameters of the preparation processes or coating processes familiar to the skilled person.

The layers applied using arc evaporation usually show a high quality over a wide range of coating conditions. Stoichiometric compound films, for example, having very high adhesion and a high density can thus be manufactured which deliver high coating quantities for metals, alloys and compositions having excellent coating uniformity over a wide range of the reaction gas pressure. A further advantage among others is also the comparatively low substrate temperatures and the relatively simple manufacture of compound films.

The cathode arc produces a plasma discharge within the material vapor released from the cathode surface. The arc spot is normally some micrometers large and has current densities of 10 amperes per square micrometer. This high current density causes a lightning fast evaporation of the starting material. The vapor generated is composed of electrons, ions, neutral vapor atoms and microdroplets. The electrons are accelerated toward the clouds of positive ions. The emissions of the cathode light spot are relatively constant over a wide range when the cathode spot is divided into a plurality of dots. The average current per dot depends on the nature of the cathode material.

In this respect, the geometry of the evaporation source also often plays a substantial role. It is thus known to use both rectangular and cylindrical evaporation sources. The selection of the geometry of the evaporation source can in this respect depend on a plurality of parameters and marginal conditions of the specific coating application.

A disadvantage of the coating plant and of the process in accordance with WO 90/02216 is inter alia that an unchanging quality of the coatings is in particular not ensured. The quality of the applied layers thus varies as the consumption of the cathode increases if the process parameters are not tracked in a complex and/or expensive manner. As is known, this is inter alia due to the fact that the rectangular cathodes show irregular consumption so that with unchanging process parameters the quality of the coating vapor becomes increasingly worse as the erosion of the cathodes increases, which can have the result of a reduction in the removal rate, which can in turn have a negative effect on the layers. To keep these negative effects within limits, the cathodes have to be replaced prematurely, which is correspondingly expensive and complicated.

A further disadvantage in addition to the irregular erosion of the cathodes is that a control of the arc on the cathode is very difficult and complicated, if possible at all.

It is therefore frequently more advantageous to use a cylindrical cathode, which has the advantage, as is known, that the cylindrical cathode is rotatable about its cylinder axis and the consumption of the target material can thus be handled better. These problems have already been discussed in detail before in EP 2 159 821. By using vaporous sources in accordance with EP 2 159 821, the quality of the applied layers does not change with increasing consumption of the cathodes and the process parameters do not have to be tracked in a complex and/or expensive manner. This is inter alia due to the fact that the cylindrical cathodes are consumed uniformly so that the quality of the coating vapor remains the same with the same process parameters with increasing erosion of the cathodes. Since these negative effects practically no longer occur with evaporation sources in accordance with EP 2 159 821, the cathodes no longer have to be exchanged prematurely, which results in corresponding significant cost savings.

One problem with cylindrical cathodes which has previously not been satisfactorily solved is their frequent lack of flexibility with respect to the processes which can be used and/or to the process parameters required for a specific process. There is thus more and more the need to use one and the same evaporation source now as an atomization cathode, e.g., in a sputtering process, or in another case as an arc evaporation source in a cathode arc evaporation process. Even when a specific evaporation source should generally only be used as an atomization cathode or generally only as a cathode arc evaporation source, there is, however, nevertheless frequently the need to adapt one and the same cathode ideally to specific requirements of the coating processes. It is thus possible that, for example on the use of a different coating material, process parameters such as process chamber pressure, process gases, electrical voltages and/or currents used, etc. can also vary, whereupon the evaporation source used should be able to be set as ideally as possible.

SUMMARY OF THE EMBODIMENTS

Embodiments of the invention are directed to an improved evaporation source, in particular for use in an atomization processes, specifically in a sputtering process or in a vacuum arc evaporation process, and particularly a cathode vacuum arc evaporation process, which has a considerably increased flexibility in comparison with the prior art both with respect to the coating processes used and with respect to the varying process parameters such as electrical currents used in the coating process, voltages, coating materials used, process gases used and other process parameters. In further embodiments, an evaporation source makes it possible on the basis of much more flexible adaptation possibilities to specific process requirements to provide coatings of a higher quality and which also allows, in addition to an increased flexibility, a more efficient use of the target material in practice. Moreover, a longer service life of the evaporation source should be achieved and whereby ultimately the costs of the coating processes can also be reduced.

Embodiments of the invention are characterized by the features of independent claim 1.

The dependent claims relate to particularly advantageous embodiments of the invention.

Embodiments of the invention thus relate to a cylindrical evaporation source which includes, at an outer cylinder wall, a target material to be evaporated as well as a first magnetic field source and a second magnetic field source which form at least a part of a magnet system and are arranged in an interior of the cylindrical evaporation source for generating a magnetic field. In this respect, the first magnetic field source and the second magnetic field source are provided at a carrier system such that a shape and/or a strength of the magnetic field can be set in a predefinable spatial region in accordance with a predefinable scheme. In accordance with the invention, the carrier system is configured for setting the shape and/or the strength of the magnetic field such that the first magnetic field source is arranged at a first carrier arm and is pivotable by a predefinable first pivot angle with respect to a first pivot axis.

Since at least the first magnetic field source is arranged at a first carrier arm and is pivotable by a predefinable first pivot angle with respect to a first pivot axis so that the magnetic field generated overall by the magnet system can be set extremely flexibly with respect to the magnetic field strength and/or with respect to the spatial magnetic field geometry generated by the magnet system, it has become possible for the first time to provide an evaporation source which has a previously unknown flexibility both with respect to the coating processes which can be used with the evaporation source and with respect to the process parameters to be used.

The problem of cylindrical evaporation sources known from the prior art with respect to their lack of adaptability to changed process conditions is thus solved satisfactorily for the first time by the evaporation source in accordance with the invention. One and the same evaporation source in accordance with the invention can be used in a previously not possible flexibility in very different coating processes, whether in atomization processes or arc evaporation processes and the evaporation source can be set extremely flexibly to the process parameters required for a specific process, with an adaptation to a variation breadth of the most varied process parameters being able to be realized to an extent such as was previously not possible with evaporation sources known from the prior art.

A further substantial advantage of the present invention is that it may be possible to dispense with a second magnet system with an evaporation source in accordance with the invention because the magnet system can simply be displaced to the position of a second magnet system required in the prior art due to the large number of available spatial degrees of freedom in the positioning of the magnet system of an evaporation source in accordance with the invention. In specific cases, it is even possible to construct the magnetic field from two different magnet systems with the aid of a single magnet system in accordance with the invention simply because the individual components of the magnet system in accordance with the invention can be set very flexibly.

The constantly increasing need of using one and the same evaporation source now as an atomization cathode, e.g., in a sputtering process, or in another case as an arc evaporation source in a cathode or anode arc evaporation process is thus satisfied for the first time to a sufficient extent by the present embodiments.

Even when a specific evaporation source in accordance with the embodiments should generally only be used as an atomization cathode or generally only as an anode or cathode arc evaporation source, one and the same evaporation source in accordance with the invention can be ideally adapted to specific requirements of the coating processes. It is thus possible that, for example on the use of a different coating material, process parameters such as process chamber pressure, process gases, electrical voltages and/or currents used, etc. can also vary, whereupon the evaporation source used are set simply and without problem by a simple adjustment of the magnetic field.

An evaporation source in accordance with the embodiments can even be set in an extremely flexible manner to varying demands during one and the same coating process. For instance, during a coating process, for example, there is complete freedom in the reaction to new process parameters due to the variety of possibilities of varying the magnetic field which is generated by the magnet system. Complex layer systems having varying properties, for example, having varying chemical compositions, hardness, adhesion strength, tribological properties, etc., can thus be generated in one and the same coating process because the evaporation source in accordance with the embodiments can be adapted practically to any required technical marginal condition of the process by adaptation of the magnetic field strength or of the spatial magnetic field geometry.

In an embodiment of an evaporation source, the second magnetic field source is arranged at a second carrier arm and is likewise pivotable by a predefinable second pivot angle with respect to a second pivot axis.

In this respect, the magnet system can particularly advantageously additionally include a first magnetic element and/ or additionally include a second magnetic element, wherein the first magnetic field source and/or the second magnetic field source and/or the first magnetic element and/or the second magnetic element and/or the carrier system can be configured as linearly displaceable in a predefinable spatial direction.

It is very particularly preferred in this respect to arrange the first magnetic field source and/or the second magnetic field source and/or the first magnetic element and/or the second magnetic element and/or the carrier system in a linearly displaceable manner in a direction perpendicular to a longitudinal axis of the carrier system and in particular simultaneously to arrange it in a linearly displaceable manner perpendicular to the longitudinal axis and in parallel with a bisectrix of a total pivot angle which results as a total angle between the first magnetic field source and the second magnetic field source.

Additionally or alternatively, with an evaporation source in accordance with the embodiments, the first magnetic field source and/or the second magnetic field source and/or the first magnetic element and/or the second magnetic element and/or the carrier system can be arranged in a linearly displaceable manner in a direction in parallel with the longitudinal axis of the carrier system.

In practice, with an evaporation source in accordance with the invention, the first magnetic field source and/or the second magnetic field source and/or the first magnetic element and/or the second magnetic element and/or the carrier system can alternatively or additionally optionally also be arranged rotatable by a predefinable angle of rotation about an axis of rotation, with the axis of rotation preferably being in parallel with the longitudinal axis of the carrier system.

In another specific embodiment in accordance with the invention, the first magnetic field source and/or the second magnetic field source and/or the first magnetic element and/or the second magnetic element and/or the carrier system can further alternatively or additionally also be arranged tiltable about a tilt axis.

An evaporation source in accordance with the invention can thus also have a flexibility with respect to all conceivable spatial degrees of freedom, that is with respect to displacements, tilts, rotations and pivots, of all components present in the magnet system toward or with respect to one another which makes possible for the first time an adaptation of the strength and of the spatial geometry of the magnetic field generated by the magnet system to practically any conceivable process parameter combination.

The first magnetic element and/or the second magnetic element can in this respect be configured very differently in practice with respect to their realization and/or their positioning within the magnet system.

The first magnetic element and/or the second magnetic element can thus, for example, be arranged with respect to the bisectrix of the total pivot angle at a predefinable spacing from the longitudinal axis of the carrier system, preferably, but not necessarily, at a yoke, specifically at a yoke of a ferritic material. And/or the first magnetic element and/or the second magnetic element can also be an additional magnet or also the yoke itself.

It is self-explanatory in this respect that the first magnetic field source and/or the second magnetic field source and/or the first magnetic element and/or the second magnetic element is/are a permanent magnet, e.g., of the neodymium or of the samarium type, and/or a ferrite and/or an electromagnet, with a strength of the magnetic field of the first magnetic field source and/or of the second magnetic field source and/or of the first magnetic element and/or of the second magnetic element being able to be controlled or regulated.

The skilled person in this respect easily understands that, depending on the demand, a magnet system in accordance with the invention can also include even further magnetic field sources or even further magnetic elements which can be configured and arranged so suitably that the flexibility of the adjustability of the magnetic field strength or of the spatial design of the magnetic fields is improved even further.

It is in this respect directly clear to the skilled person that the magnet system can in principle be suitable for forming a magnetic field of any desired strength or of any desired spatial geometry and can, for example, form a balanced or an unbalanced magnetron.

Typical magnetic field strengths in sputtering are in this respect, for example, in a range from 10 mT to 500 mT, preferably between 25 mT to 100 mT, for example, in the balanced or unbalanced operating mode. The absolute magnetic field strengths can naturally vary spatially more or less strongly in practice and can naturally also have field strengths which can lie considerably above or below the indicated values.

Typical magnetic field strengths in arc evaporation are in this respect, for example, in a range from 0.1 mT to 50 mT, preferably between 1 mT to 20 mT. The absolute magnetic field strengths can naturally vary spatially more or less strongly in practice and can naturally also have field strengths which can lie considerably above or below the indicated values.

In this respect, as already mentioned a number of times, an evaporation source in accordance with the invention can be configured as an evaporation cathode or as an evaporation anode such that the evaporation cathode can be used both as an atomization cathode and as an arc evaporation source, in particular as an arc cathode.

It is understood that in practice further components can be provided which are required in practice with an evaporation source in accordance with the invention and known to the skilled person per se. A cooling system known per se can, e.g., in particular be present such as is known per se to the skilled person from the prior art, wherein the evaporation source can also often completely dispense with an additional cooling system due to its design, which can specifically be a further advantage of the present invention.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein:

FIG. 2a illustrates a plan view of a second embodiment of an evaporation source in accordance with the invention having two additional magnetic elements;

FIG. 2b illustrates the evaporation source of FIG. 2a, with the second magnetic element being configured in the form of a ferrite yoke;

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1A:
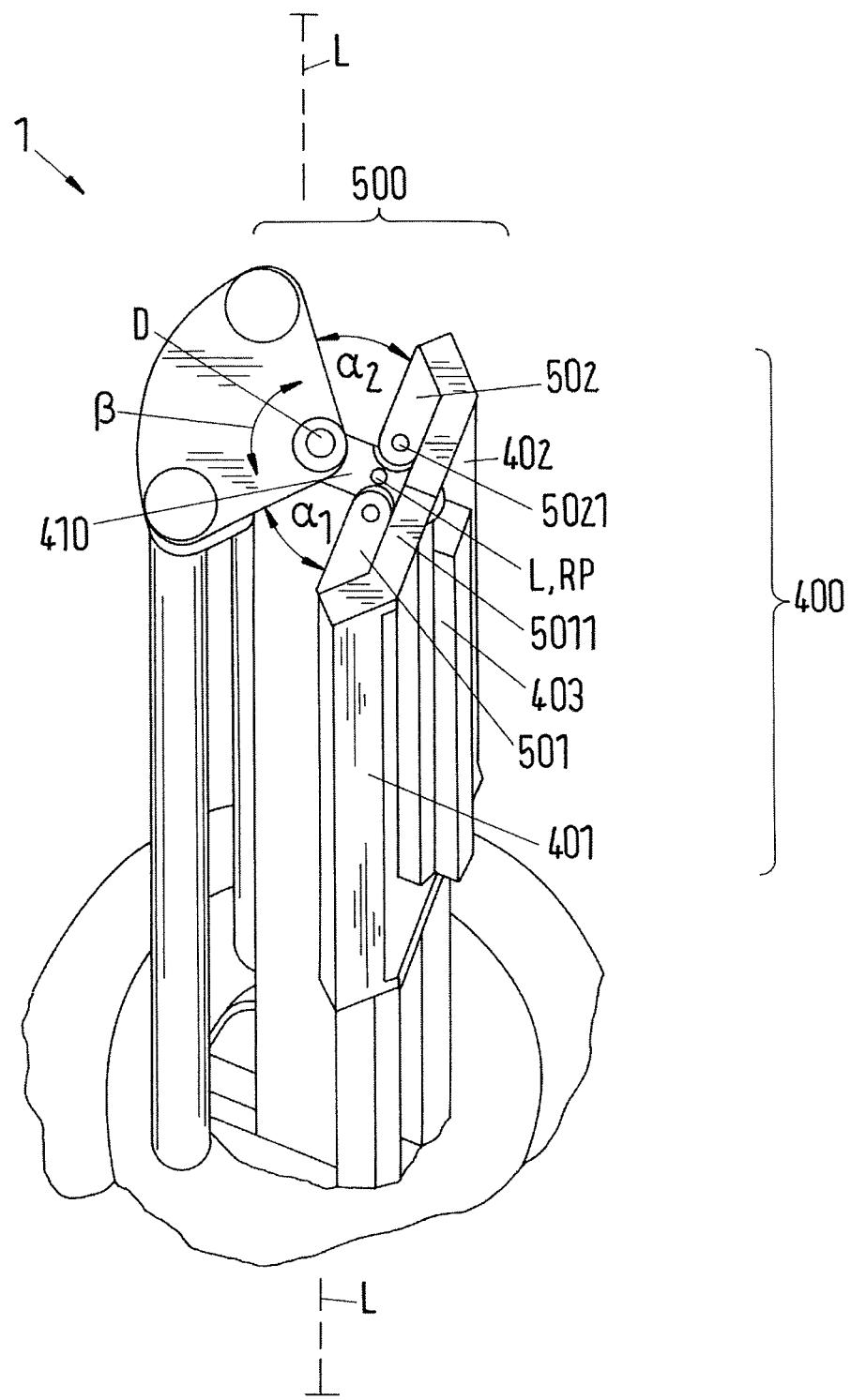
FIG. 1a illustrates a first simple embodiment of an evaporation source in accordance with the invention in a perspective representation.
Figure 1B:
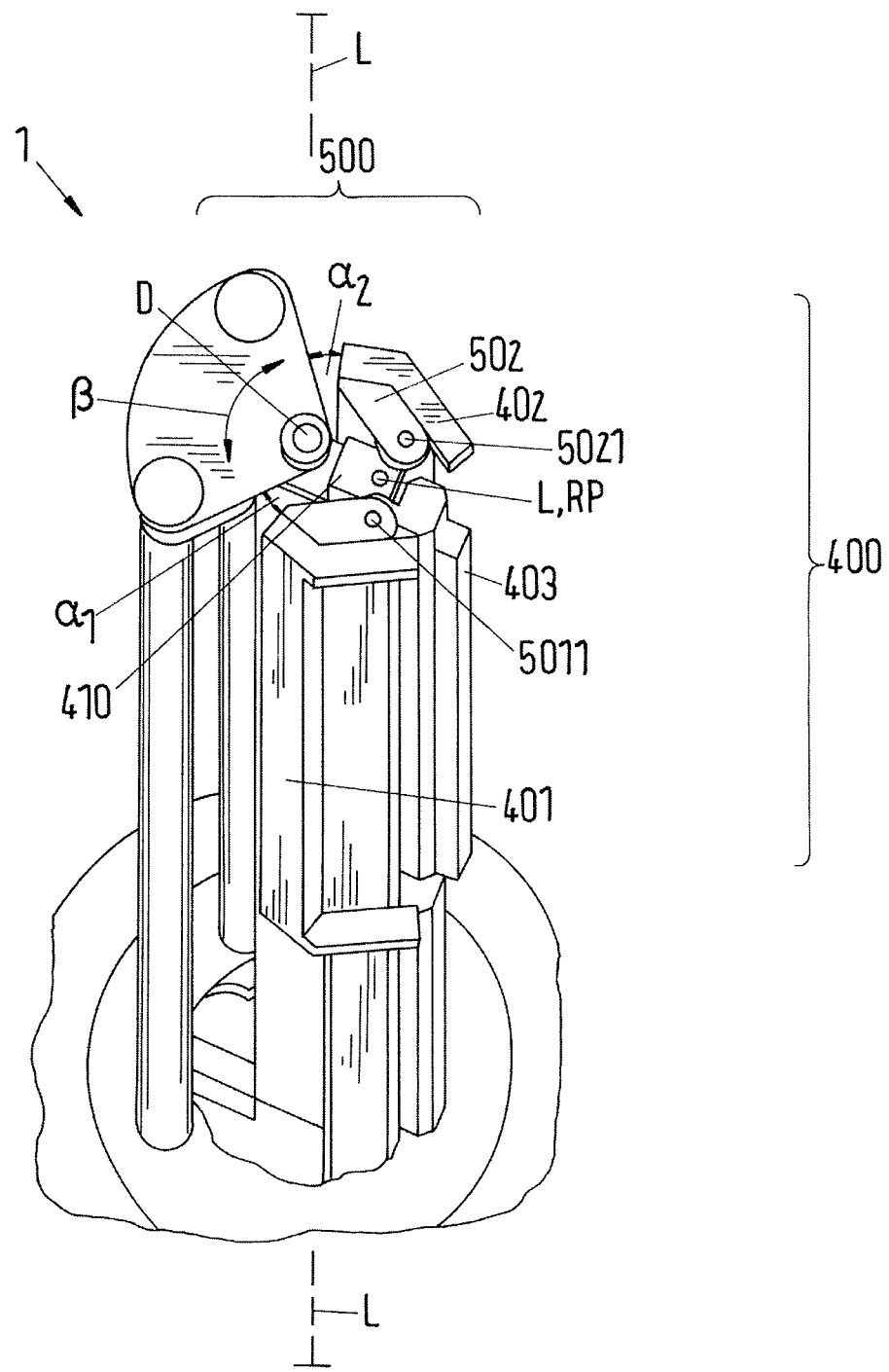
FIG. 1b illustrates the evaporation source of FIG. 1a with magnetic field sources greatly pivoted with respect to one another.

FIG. 1a shows in a schematic representation a first simple embodiment of an evaporation source in accordance with the invention in a perspective representation, wherein an evaporation source in accordance with the invention will be designed as a whole by the reference numeral 1 in the following. FIG. 1b in this respect shows the evaporation source 1 of FIG. 1a with magnetic field sources 401, 402 greatly pivoted with respect to one another.

The evaporation source 1 in accordance with the embodiments of FIG. 1a and FIG. 1b is in particular designed for use in a sputtering process or in a vacuum arc evaporation process, preferably for use in a cathode vacuum arc evaporation process. The cylindrical evaporation source 1 is surrounded by an outer cylinder wall 2, not shown for reasons of clarity in FIG. 1a and FIG. 1b, including a target material 3 to be evaporated such as is clearly shown for an analog embodiment, e.g., with reference to FIG. 2a and FIG. 2b and is known per se from the prior art.

The evaporation source 1 in accordance with the invention further includes a first bar-like magnetic field source 401 and a second bar-like magnetic field source 402 as central components which each extend in the longitudinal direction L, with the magnetic field sources 401, 402 forming a part of a total magnet system 400 and being arranged as described in parallel with the longitudinal direction L in an interior of the cylindrical evaporation source 1 for generating a magnetic field. In this respect, the first magnetic field source 401 and the second magnetic field source 402 are provided at a carrier system 500 such that a shape and/or a strength of the magnetic field can be set in a predefinable spatial region in accordance with a predefinable scheme. In accordance with the present invention, the carrier system 500 is configured for setting the shape and/or the strength of the magnetic field such that the first magnetic field source 401 is arranged at a first movable carrier arm 501 and is pivotable by a predefinable pivot angle $\alpha_1$ with respect to a first pivot axis 5011. The second magnetic field source 402 is equally arranged at a second movable carrier arm 502 and is pivotable by a predefinable pivot angle $\alpha_2$ with respect to a second pivot axis.

In addition, the magnet system 400 includes a first magnetic element 403 which is likewise arranged at the carrier system in the longitudinal direction between the two bar-like magnetic field sources 401, 402

In the present specific embodiment of FIG. 1a or FIG. 1b, the first magnetic field source 401, the second magnetic field source 402 and the first magnetic element 403 each form a bar magnet. In an analog embodiment, the first magnetic field source 401 or the second magnetic field source 402 or the first magnetic element 403 can also be formed by a plurality of respective individual permanent magnets arranged in the longitudinal direction, which is also known per se in principle from the prior art. It is self-explanatory in this respect that the first magnetic field source 401 or the second magnetic field source 402 or the first magnetic element 403 can also include a ferrite or can be formed by an electromagnet or can be realized by another magnetic element known per se.

As can be seen very clearly from FIG. 1a or FIG. 1b as well as from FIG. 2a and FIG. 2b, the ferrite yoke 410 of the central magnet row has arcuate adapted portions which allow the geometry of the pivot wing 501, 502 to be projected into itself so that a magnetic circuit is ensured which is as ideal as possible in a wide angular range $\alpha_1, \alpha_2$ during the total pivot movement between the magnetic field sources 401, 42 and/or the carrier arms 501, 502 and the yoke 401 during the total pivot movement about the pivot axes 5011, 5012.

The first magnetic field source 401 and/or the second magnetic field source 402 and/or the first magnetic element 403 and/or the second magnetic element 404 and/or the carrier system 500 are in this respect arranged rotatable by a predefinable angle of rotation $\beta$ about an axis of rotation D, with the axis of rotation D preferably being in parallel with the longitudinal axis L of the carrier system 500. The rotation by the angle of rotation $\beta$ can in this respect satisfy a plurality of functions. By rotation by the angle of rotation $\beta$, the total magnet system 400 can, for example, be set relative to a substrate to be coated. In addition, a relative position toward a second evaporation source, if present, can naturally also be set. The magnet system 400 can naturally be so-to-say flipped over by a rotation of approximately 180° C. by the angle of rotation $\beta$, which can be used advantageously, for example, with respect to the first magnetic element 403 to sputter the surface free at a predefinable region.

FIG. 1b differs from FIG. 1a in this respect only in that the first magnetic field source 401 and the second magnetic field source 402 in FIG. 1b are pivoted very greatly, almost to a maximum, toward one another, whereas in the example of FIG. 1a, the first magnetic field source 401 and the second magnetic field source 402 are not pivoted with one another, but rather form a stretched angle with one another of a total of 180°.

In addition, the carrier systems 500 is rotatably by the angle of rotation $\beta$ about the axis of rotation D so that the target material 3 can be evaporated consecutively from different regions of the surface of cylinder wall 2 on the cylinder wall not shown in FIG. 1a or FIG. 1b by rotating the carrier system 500 and thus by rotating the magnet system 400.

It is, e.g., possible in this connection that different regions of the surface are gradually evaporated so that, e.g., a more uniform removal of the target material 3 takes place and/or the service life of the evaporation source is increased and/or a coating quality of a coating to be applied to a substrate by the evaporation process is improved. The magnet system can, e.g., also be pivoted alternately to and from in an oscillating movement about the axis of rotation D or the target material 3 can be evaporated from the surface of the cylinder wall 2 in another suitable manner in an advantageous process.

Figure 1C:
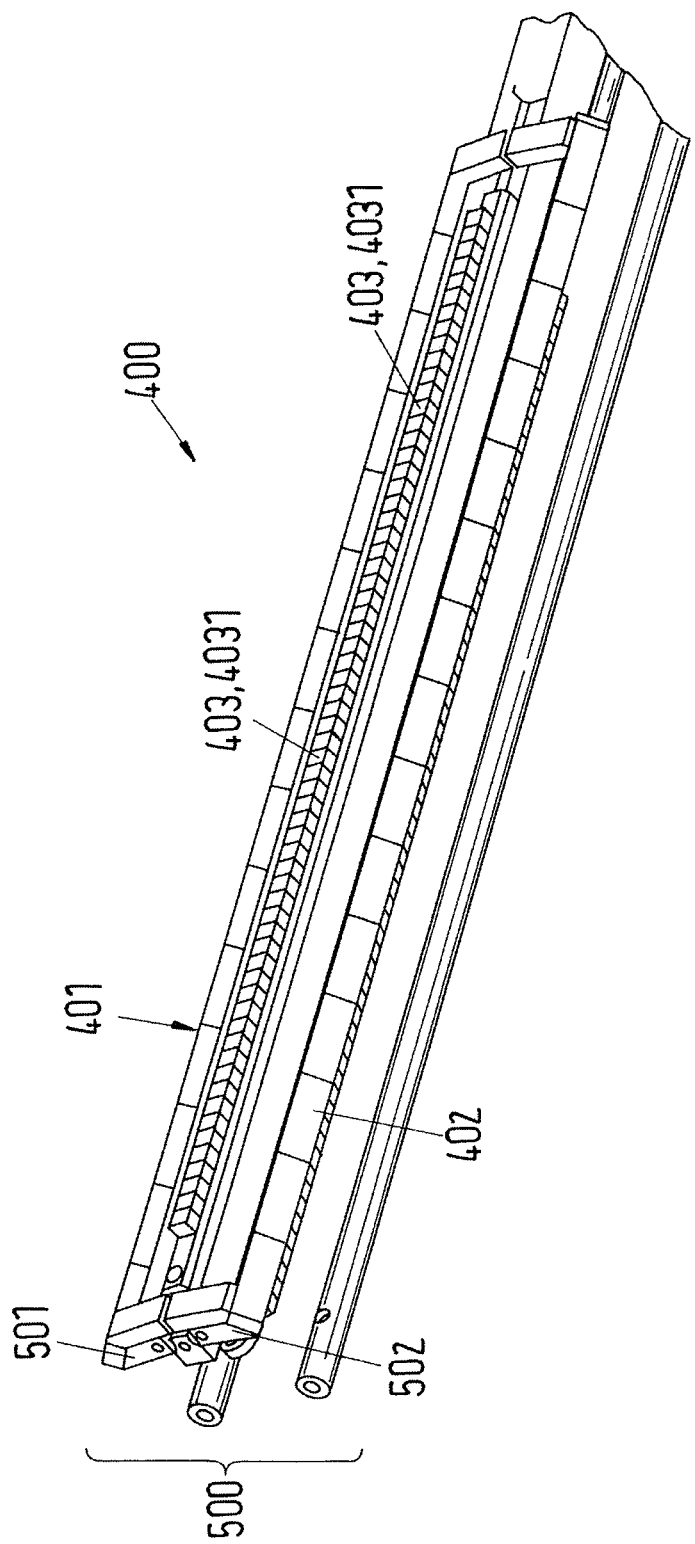
FIG. 1c illustrates the magnet system of the evaporation source of FIG. 1a in a perspective view.

FIG. 1c shows the magnet system 400 of the evaporation source 1 of FIG. 1a again for illustration in a perspective view which better illustrates the mutual arrangement of the first magnetic field source 401, the second magnetic field source 402 and the first magnetic element 403. It can clearly be recognized that in this specific embodiment the magnetic element 403 is formed from a plurality of individual permanent magnets 4031 mutually arranged in rows.

FIG. 2a shows a plan view of a second embodiment of an evaporation source 1 in accordance with the invention having two additional magnetic elements 403, 404, wherein the embodiment of FIG. 2b differs from the evaporation source of FIG. 2a in that the second magnetic element 404 is formed in the form of a ferrite yoke 410 so that no additional magnet 404 is necessary such as is the case in the embodiment of FIG. 2a.

In the cylindrical evaporation source 1 having an outer cylinder wall 2 on which a target material 3 to be evaporated is provided, the first magnetic field source 401 and the second magnetic field source 402 are each mutually pivoted by the first pivot angle $\alpha_1$ with respect to the first pivot axis 5011 or by the second pivot angle $\alpha_2$ with respect to the second pivot axis 5021, wherein in the present embodiment the two pivot angles $\alpha_1$ and $\alpha_2$ are the same. That is, the first magnetic field source 401 and the second magnetic field source 402 are mutually symmetrically pivoted with respect to the bisectrix WH. It is self-explanatory that in another embodiment the first magnetic field source 401 and the second magnetic field source 402 can also be mutually asymmetrically pivoted, that is the two pivot angles $\alpha_1$ and $\alpha_2$ do not necessarily have to be the same. Typical values for the pivot angles $\alpha_1$ and $\alpha_2$ lie in the range between 0° and approximately 130°, i.e. the angles $\alpha_1$ and $\alpha_2$ can naturally also adopt values larger than 90°. Preferred pivot angles in this respect lie between approximately 60° and 110° and can naturally also adopt completely different values than the angle values mentioned above only by way of example.

As is indicated by the double arrow RS, the magnet system 400 can in the present embodiments of FIG. 2a and FIG. 2b be displaced in a linear manner in the direction RS perpendicular to a longitudinal axis L of the carrier system 500 for varying the magnetic field strength and/or the spatial geometry of the magnetic field generated by the magnet system 400 and can in particular be simultaneously displaced in a linear manner perpendicular to the longitudinal axis L and in parallel with the bisectrix WH of the total pivot angle $\alpha_{12}$.

The displacement along the direction RS can in this respect satisfy different functions. It can serve, for example, to set the magnetic field strength of the first magnetic element 403 with respect to the evaporator surface from a very high value, when the first magnetic element 403 is located close to the surface, to a lower value, when the first magnetic element 403 is located further away from the surface, for example to change from a magnetron mode to an arc mode. Furthermore, the magnetic field strength can also be kept constant by a displacement along the direction RS with a reducing target thickness at the evaporator surface. Finally, a displacement along the direction RS can also be utilized to displace the second magnetic element 404 in the direction toward the rear functional surface of the evaporator surface 1.

The movement of the carrier system or of individual components of the carrier system can in this respect take place using simple mechanical devices and measures known per se. The linear movement and/or the tilt or pivot or rotational movement of the magnet system 400 or of individual components can thus take place alone, as, for example, the movement of the yoke 410 via suitably provided threaded spindles, possibly in conjunction with a chain drive. In this respect, the drive can naturally take place simply by hand by an operator, but suitable actuating motors can also be provided so that the drive can take place electrically, specifically even fully automatically by means of a computer control.

Figure 3:
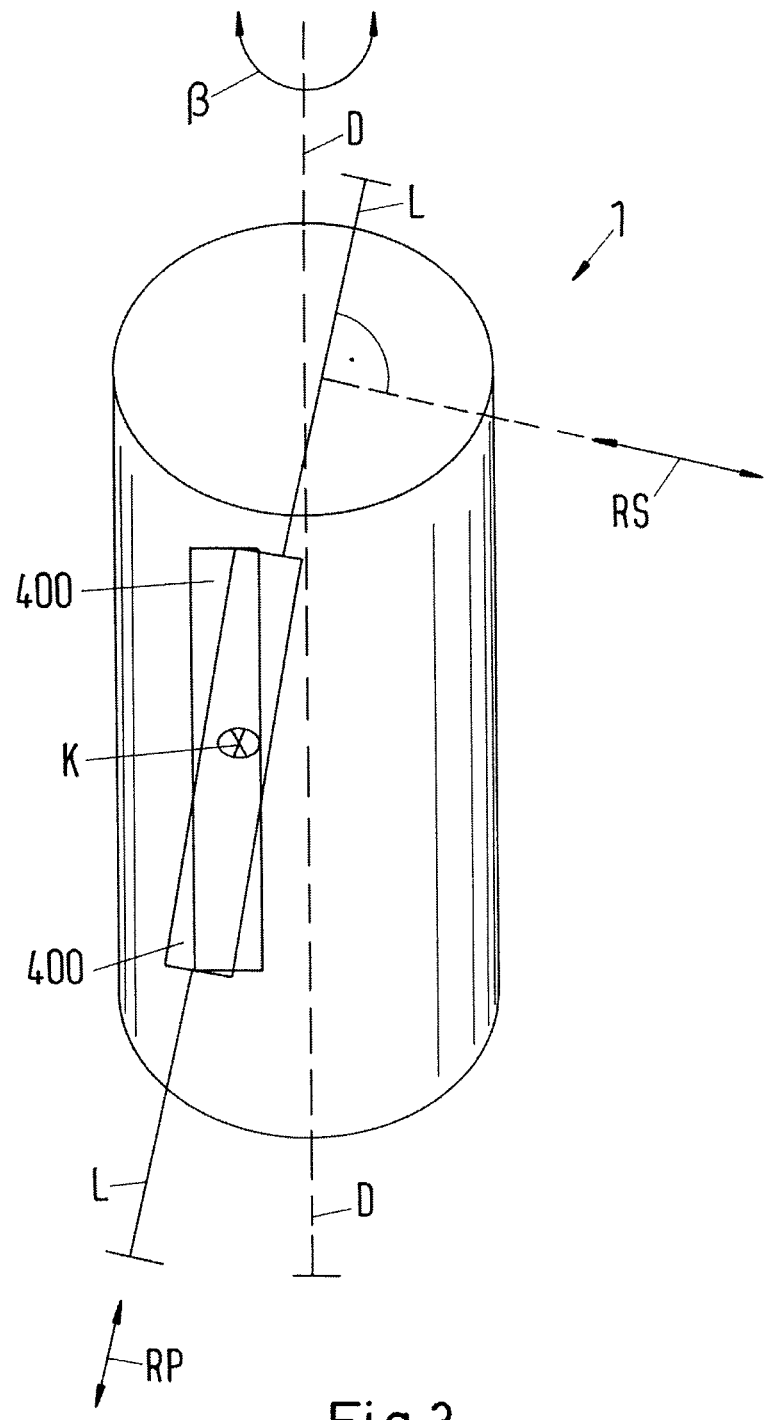
FIG. 3 illustrates a third embodiment with a tiltable magnetic field source.

In this respect, as already mentioned, the magnet system 400 can also be adjusted with respect to the longitudinal axis L via a tilt movement, as will be explained with reference to FIG. 3 for a third embodiment in a very schematic drawing.

Figure 4C:
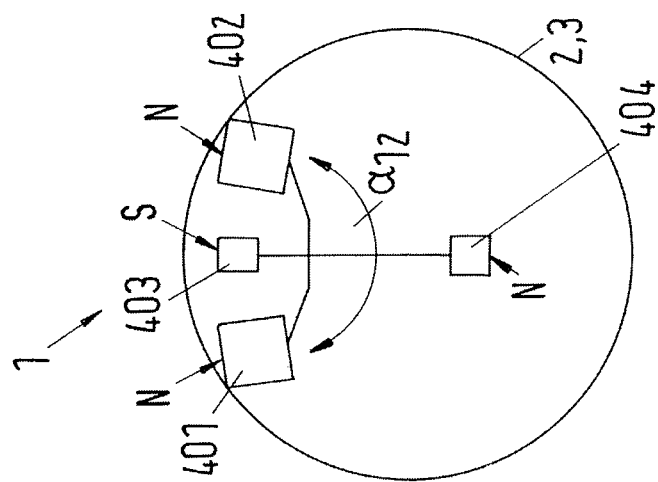
FIG. 4c illustrates the embodiment of FIG. 4a set as an unbalanced magnetron.
Figure 4B:
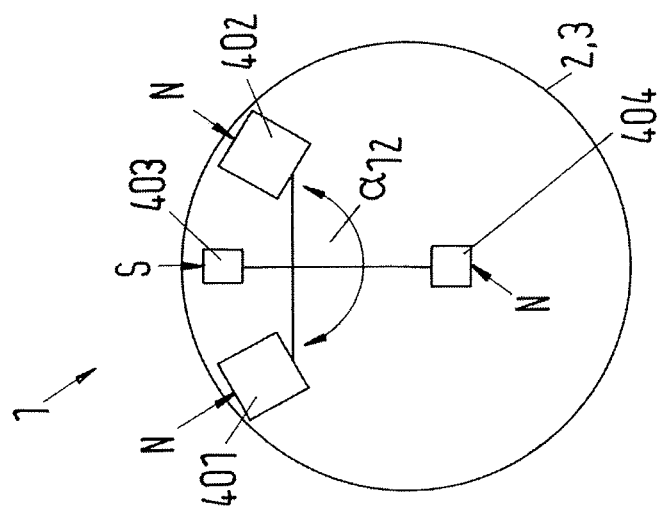
FIG. 4b illustrates the embodiment of FIG. 4a set as a balanced magnetron.
Figure 4A:
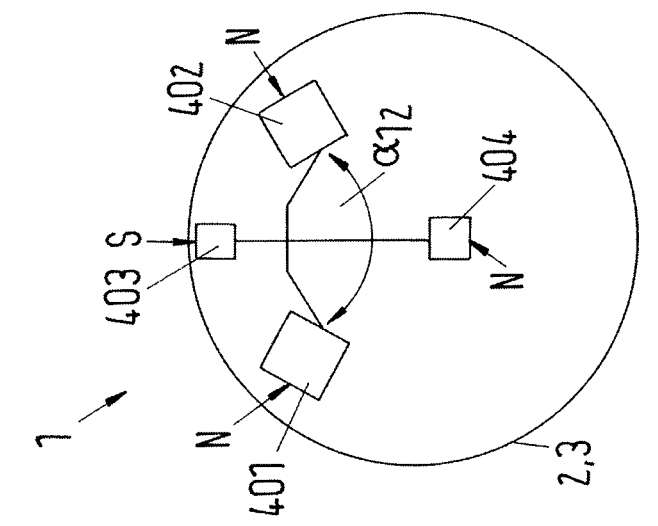
FIG. 4a illustrates a fourth embodiment in the form of a sputter source, set as a very balanced magnetron.

A fourth embodiment of an evaporation source 1 in accordance with the invention is shown very schematically with respect to FIG. 4a to FIG. 4c. FIG. 4a, FIG. 4b and FIG. 4c in this respect show one and the same evaporation source 1, which are, however, shown in three different operating modes as sputter sources in the three Figures, which impressively demonstrates the huge flexibility of the evaporation source 1 in accordance with the invention.

FIG. 4a shows an embodiment in the form of a sputter source, with the individual magnetic components being selected and the magnet system 400 being set to a total pivot angle $\alpha_{12}$ smaller than 180° such that the magnet system works in the operating mode of a balanced magnetron.

In FIG. 4b, the total pivot angle $\alpha_{12}$ of the sputter source of FIG. 4a was selected at approximately 180°, which has the result that the embodiment of FIG. 4 now works in the operating mode of a very balanced magnetron.

In FIG. 4c, the total pivot angle $\alpha_{12}$ of the sputter source of FIG. 4a was selected larger than 180° so that the sputter source here works in the operating mode of an unbalanced magnetron.

Figure 5B:
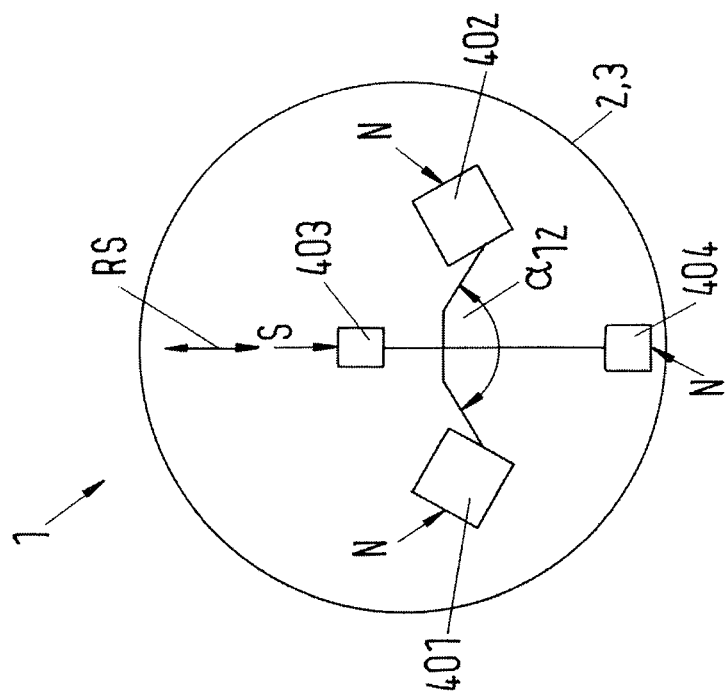
FIG. 5b illustrates the embodiment of FIG. 5a for using the arc on the oppositely disposed side.
Figure 5A:
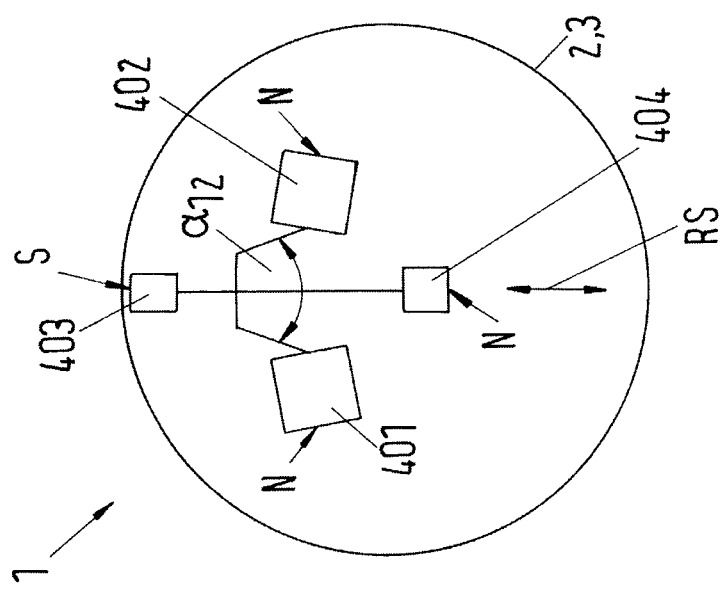
FIG. 5a illustrates the embodiment of FIG. 4a in the form of an arc evaporation source.

As FIGS. 5a and 5b show, the evaporation source 1 of FIG. 4a can, however, also be set as an arc evaporation source. This is in particular achieved in FIG. 5a in that the total pivot angle $\alpha_{12}$ of the sputter source of FIG. 5a is selected a lot smaller than 180°. In FIG. 5b, the magnet system 400 was displaced in a linear manner in the direction of the side disposed opposite in accordance with the illustration. The evaporation source 1 can thereby still be operated as an arc evaporation source; however, the target material 3 is now arced free or sputtered free on the oppositely disposed side of the evaporation source 1, with a shutter, e.g., a tubular shutter, having corresponding cut-outs being able to be provided in a manner known per se so that the first magnetic element 403 or the second magnetic element 404 can be covered as required. In particular a more uniform material removal, and thus in particular a higher service life of the evaporation source 1, can be achieved by this measure or by other measures known per se.

It is self-explanatory that the specific operating mode in which the evaporation source 1 in accordance with the invention can be operated does not depend solely on whether the total pivot angle $\alpha_{12}$ between the first magnetic field source 401 and the second magnetic field source 402 is larger or smaller than 180° or equal to 180°. Other parameters such as the magnetic strength of the individual components of the magnet system, their spacing from one another, etc. rather likewise naturally also have a substantial influence on the operating mode in the specific case, which the skilled person is naturally easily aware of and he naturally also knows how the total geometry of the magnet system 400 has to be set to maintain the desired operating mode.

A considerably improved evaporation source, in particular for use in an atomization process, specifically in a sputtering process or in a vacuum arc evaporation process, in particular a cathode or anode vacuum arc evaporation process, which has a considerably increased flexibility in comparison with the prior art both with respect to the coating processes used and with respect to the varying process parameters such as electrical currents used in the coating process, voltages, coating materials used, process gases used and other process parameters, is thus provided for the first time by the present invention. In addition, the evaporation source in accordance with the invention in practice also allows a more efficient use of the target material due to the much more flexible adaptation possibilities to specific process demands to provide coatings of very high quality, with additionally a longer service life of the evaporation source being achieved and thus ultimately the costs of the coating processes also being noticeably reduced.

It is self-explanatory in this respect that the previously explained embodiment variants also shown schematically in the Figures can also advantageously be combined with one another to faun further embodiments to meet specific demands in practice. Simple further developments obvious to the skilled person are naturally furthermore also covered by the invention.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A cylindrical evaporation source comprising:
   a target material arranged on an outer cylindrical wall;
   a carrier system yoke disposed inside the outer cylindrical wall and being elongate when viewed from an axial direction of the outer cylindrical wall;
   said carrier system yoke having an outer end, an inner end arranged closer to a center of the outer cylindrical wall than the outer end, and first and second opposite sides;
   a magnet system comprising:
      an elongate first magnetic field source being elongate when viewed from an axial direction of the outer cylindrical wall and being disposed inside the outer cylindrical wall, said elongate first magnetic field source having a first end spaced from a center of the elongate first magnetic source and an oppositely arranged free end spaced from the center of the elongate first magnetic source; and an elongate second magnetic field source being elongate when viewed from an axial direction of the outer cylindrical wall and being disposed inside the outer cylindrical wall, said elongate second magnetic field source having a first end spaced from a center of the second magnetic source and an oppositely arranged free end spaced from the center of the second magnetic source;

the first magnetic field source pivoting with respect to the carrier system yoke about a first axis;

said free end of the first magnetic field source being movable from a first angular position relative to the first opposite side of the carrier system yoke to a second smaller angular position that is alongside the first opposite side;

the second magnetic field source pivoting with respect to the carrier system yoke about a second axis; and said free end of the second magnetic field source being movable from a first angular position relative to the second opposite side of the carrier system yoke to a second smaller angular position that is alongside the second opposite side, wherein the first and second axes are spaced from each other and are offset from a center axis of the outer cylindrical wall.

2. The evaporation source of claim 1, further comprising:
a first pivotally movable carrier arm that supports or is coupled to the first magnetic field source; and
a second pivotally movable carrier arm that supports or is coupled to the second magnetic field source.

3. The evaporation source of claim 1, wherein the carrier system yoke is configured to set a position of each of the first and second magnetic field sources relative to the outer cylindrical wall.

4. The evaporation source of claim 1, wherein each of the first and second magnetic field sources are movable relative to the outer cylindrical wall in order to change a shape and/or a strength of a magnetic field produced by the first and second magnetic field sources.

5. The evaporation source of claim 1, wherein each of the first and second magnetic field sources are movable:
independent of one another; or
independent of one another in order to change a shape and/or a strength of a magnetic field produced by the first and second magnetic field sources.

6. The evaporation source of claim 1, wherein the first and second magnetic field sources respectively comprise first and second pivotally movable carrier arms and that pivot between a predetermined angular range.

7. The evaporation source of claim 1, wherein the magnet system further comprises one of:
a first magnetic element; and
a first magnetic element that is movable one of:
linearly;
perpendicular to a center axis of the outer cylindrical wall; and
towards and away from a center axis of the outer cylindrical wall.

8. The evaporation source of claim 7, wherein the magnet system further comprises one of:
a second magnetic element; or
a second magnetic element that is movable one of:
linearly;
perpendicular to a center axis of the outer cylindrical wall; and
towards or away from a center axis of the outer cylindrical wall.

9. The evaporation source of claim 8, wherein either of the first and second magnetic elements comprises one of:
a permanent magnet;
a ferrite; and/or
an electromagnet.

10. The evaporation source of claim 2, wherein each of the first and second pivotally movable carrier arms respectively pivot about the first and second axes.

11. The evaporation source of claim 1, wherein the center axis of the outer cylindrical wall is parallel with a rotation axis of the carrier system yoke.

12. The evaporation source of claim 1, wherein the carrier system yoke is movable parallel to the center axis.

13. The evaporation source of claim 1, wherein the carrier system yoke is rotatable between a predetermined angular range about the center axis.

14. The evaporation source of claim 1, wherein the carrier system yoke is tiltable about a tilt axis of the carrier system.

15. The evaporation source of claim 14, wherein the tilt axis is spaced from the center axis.

16. The evaporation source of claim 1, wherein the carrier system yoke comprises:
a ferrite material.

17. The evaporation source of claim 1, wherein either of the first and second magnetic field sources comprises one of:
a permanent magnet;
a ferrite; and/or
an electromagnet.

18. The evaporation source of claim 1, wherein the magnet system is one of:
a balanced magnetron; or
an unbalanced magnetron.

19. The evaporation source of claim 1, wherein the evaporation source is one of:
an evaporation cathode;
an evaporation anode;
an atomization cathode;
an arc evaporation source; or
an arc cathode.

20. A cylindrical evaporation source comprising:
a target material arranged on a rotatable outer cylindrical wall;
a movable carrier system yoke disposed inside the outer cylindrical wall;
said carrier system yoke having an outer end, an inner end arranged closer to a center of the outer cylindrical wall than the outer end, and first and second opposite facing sides;
a magnet system mounted to the carrier system and comprising:
a first pivotally mounted magnetic field source disposed inside the outer cylindrical wall and having a first end and a free end arranged opposite the first end;
the first end and the free end of the first magnetic field source being spaced by different distances from a pivot axis of the first magnetic field source;
a second pivotally mounted magnetic field source disposed inside the outer cylindrical wall and having a first end and a free end arranged opposite the first end;

the first end and the free end of the second magnetic field source being spaced by different distances from a pivot axis of the second magnetic field source;

the free end of the first pivotally mounted magnetic field source pivoting towards the first opposite facing side and away from the outer cylindrical wall and vice versa; and the free end of the second pivotally mounted magnetic field source pivoting towards the second opposite facing side and away from the outer cylindrical wall and vice versa, wherein one of:
- a spacing distance between the first and second opposite facing sides is less than a spacing distance between the pivot axes of the first and second magnetic field sources, or
- a spacing distance between the free ends of the first and second magnetic field sources is greater than a spacing distance between the first and second opposite facing sides.

21. A cylindrical evaporation source comprising:

a target material arranged on an outer cylindrical wall;

a carrier system yoke disposed inside the outer cylindrical wall;

said carrier system yoke having first and second opposite sides;

a center axis of the outer cylindrical wall passing through the carrier system yoke;

a magnet system comprising:
- a first magnetic field source disposed inside the outer cylindrical wall; and
- a second magnetic field source disposed inside the outer cylindrical wall; the first magnetic field source pivoting with respect to the carrier system yoke about a first axis between a first position and a position that is alongside the first opposite side;

the second magnetic field source pivoting with respect to the carrier system yoke about a second axis between a first position and a position alongside the second opposite side; and wherein the first and second axes are spaced from each other and are offset from the center axis of the outer cylindrical wall, wherein, in the first position, a spacing distance between the free ends of the first and second magnetic field sources is greater than a spacing distance between the first and second opposite sides.

* * * * *